United States Patent
Heinrich-Barna et al.

(10) Patent No.: US 10,535,409 B2
(45) Date of Patent: Jan. 14, 2020

(54) METHOD FOR SUPPRESSING GATE OXIDE TUNNEL CURRENT IN NON-VOLATILE MEMORY TO REDUCE DISTURBS

(71) Applicant: Texas Instruments Incorporated, Dallas, TX (US)

(72) Inventors: Stephen K. Heinrich-Barna, Lucas, TX (US); Clyde F. Dunn, Sugar Land, TX (US); Aswin N. Mehta, Sugar Land, TX (US); John H. Macpeak, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/394,095

(22) Filed: Dec. 29, 2016

(65) Prior Publication Data
US 2017/0194056 A1    Jul. 6, 2017

Related U.S. Application Data

(60) Provisional application No. 62/273,353, filed on Dec. 30, 2015.

(51) Int. Cl.
*G11C 16/10*    (2006.01)
*G11C 16/34*    (2006.01)
*G11C 16/04*    (2006.01)

(52) U.S. Cl.
CPC ...... *G11C 16/3427* (2013.01); *G11C 16/0425* (2013.01); *G11C 16/10* (2013.01)

(58) Field of Classification Search
CPC . G11C 16/3427; G11C 16/0425; G11C 16/10; G11C 16/3418

USPC ........................................ 365/185.02, 185.05
See application file for complete search history.

(56) References Cited

U.S. PATENT DOCUMENTS

| | | | | |
|---|---|---|---|---|
| 5,898,616 A | * | 4/1999 | Ono ................... | G11C 16/0416 365/185.11 |
| 2008/0123416 A1 | * | 5/2008 | Chih .................. | G11C 16/0433 365/185.05 |
| 2012/0063223 A1 | * | 3/2012 | Lee .................... | G11C 16/0433 365/185.02 |
| 2015/0054050 A1 | * | 2/2015 | Perera ............... | H01L 21/28273 257/316 |

(Continued)

OTHER PUBLICATIONS

Markov et al., "SuperFlash® Scaling Aspects: Program Disturb," 2016 IEEE 8th International Memory Workshop, Electronic ISBN: 978-1-4673-8833-7, 4 pages.

*Primary Examiner* — Alfredo Bermudez Lozada
(74) *Attorney, Agent, or Firm* — Kenneth Liu; Charles A. Brill; Frank D. Cimino (57) ABSTRACT

A disturb management technique for a non-volatile memory including first and second memory cells includes programming the first memory cell by applying a first voltage to a first word line coupled to the first memory cell and a second voltage to a terminal, such as a source terminal, shared by the first memory cell and the second memory cell. A non-zero third voltage having the same sign as the second voltage is applied to a second word line coupled to the second memory cell. The applied non-zero third voltage reduces a tunnel current across a gate oxide that insulates the second word line from a substrate of the second memory cell. This results in the second memory cell having a lower likelihood of being disturbed when programming the first memory cell.

25 Claims, 3 Drawing Sheets

(56) References Cited

U.S. PATENT DOCUMENTS

2016/0042790 A1* 2/2016 Tran ............... G11C 16/16
365/185.29

* cited by examiner

METHOD FOR SUPPRESSING GATE OXIDE TUNNEL CURRENT IN NON-VOLATILE MEMORY TO REDUCE DISTURBS

CROSS REFERENCE TO RELATED APPLICATION

The present application claims priority to U.S. Provisional Patent Application No. 62/273,353, titled "Method to Suppress GateOx Tunnel Current Induced Data Gain in FLASH Memories," filed Dec. 30, 2015, which is incorporated by reference herein in its entirety.

BACKGROUND

This section is intended to introduce the reader to various aspects of art that may be related to various aspects of the subject matter described and/or claimed below. This discussion is believed to be helpful in providing the reader with background information to facilitate a better understanding of the various aspects of the present disclosure. Accordingly, it should be understood that these statements are to be read in this light, not as admissions of prior art.

The present disclosure relates generally to non-volatile memory devices and, more specifically, to techniques for reducing unintended or otherwise unwanted programming events (e.g., a write) in the operation of such non-volatile memory devices.

Solid state non-volatile memory devices are widely used today in many electronic systems and have continued to experience high growth in recent years. This is attributable, at least in part, to the capability of non-volatile memory for long-term persistent data storage. For instance, when compared to volatile memories, such as dynamic random access memory (DRAM) which typically loses stored data almost immediately when power is removed, non-volatile memory does not require a power source to retain stored information. For example, some non-volatile memory devices are capable of retaining data on the order of many years.

Figure 1:
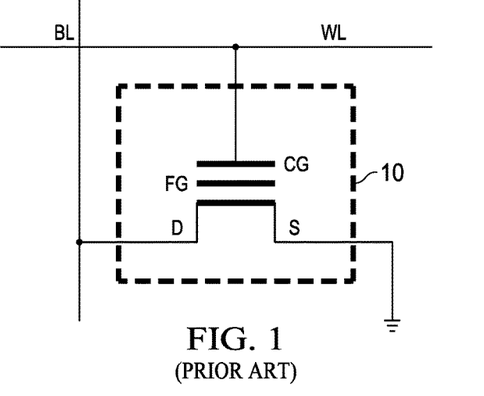
FIG. 1 is a schematic representation of a conventional non-volatile memory cell.

Non-volatile memory arrays may include bit cells arranged in rows and columns, similar to that of volatile memory. A common type of non-volatile memory bit cell utilizes a floating gate transistor to store a data state. In general, floating gate transistors are similar to conventional MOSFET transistors in structure, but include an additional gate element that is electronically isolated, hence the term "floating gate." The floating gate acts as a storage element for the bit cell. By way of background, a conventional non-volatile memory cell 10 that utilizes a floating gate transistor is shown in FIG. 1. The memory cell 10 shown here includes a single floating gate transistor with its drain (D) connected to a bit line (BL) and its control gate connected to a word line (WL). A floating gate element (FG) is physically disposed between the control gate (CG) and the channel region, and is electrically isolated, such as by a thin dielectric film, from the control gate, source, and drain. Examples of non-volatile memories based on floating gate transistors in FIG. 1 include electrically erasable programmable read only memory (EEPROM) and flash memory.

Memory cells of this type typically have two states, a "programmed" state and an "erased" state. The amount of charge trapped on the floating gate determines the state of the cell and may be controlled through program and erase operations. For example, the cell may be programmed by biasing the cell so that electrons tunnel through the thin dielectric film isolating the floating gate causing it to become negatively charged. This has the effect of increasing the threshold voltage of the transistor by shielding the channel region from the control gate so that when a read voltage is applied to the control gate, current does not conduct between the source and drain, thus corresponding to a logical 0. In an erase operation, the memory cell is biased to release electrons trapped in the floating gate. The absence of trapped electrons on the floating gate when the read voltage is applied allows for current to conduct between the source and drain, thus corresponding to a logical 1. Depending on the construction of the transistor, the tunneling mechanism may be Fowler-Nordheim (FN) tunneling or hot-carrier injection. While FIG. 1 shows a basic type of floating gate transistor, other floating gate transistor designs have since been developed. Thus, the specific physical arrangement of the floating gate relative to the other elements of the memory cell can vary depending on the particular design. Nonetheless, most floating gate transistor designs will generally operate on the concept that the amount of charge on the floating gate determines the logical state of the memory cell.

In the semiconductor industry, there is generally a continuing effort to reduce the overall size of semiconductor circuits. This is because smaller devices tend to have a competitive advantage in the market over larger counterparts, as smaller devices tend to operate more efficiently (e.g., lower power requirements), use less circuit area, and are less costly to manufacture. In accordance with this trend, the overall size of memory devices is also continuing to decrease. For example, smaller memory arrays may be achieved by using smaller manufacturing process nodes, which scales down the size of the circuitry. Additionally, certain components of memory arrays, such as drivers and sensing circuitry, may be designed such that they are shared more effectively, thus requiring fewer such components. Both techniques are frequently used to achieve increasingly smaller dimensions.

As the overall size of memory devices continues to decrease in accordance with this trend, new challenges have also been encountered. For instance, at smaller process nodes, conductive lines and other circuit components are located increasingly closer together, which can sometimes result in unwanted electrical behavior. In some non-volatile memories, it has been observed that under certain conditions, performing an operation on a selected bit cell in the array can sometimes stress nearby bit cells resulting in unintended and unwanted effects, such as unintentionally changing the date state stored by the cell (e.g., from 1 to 0, or vice versa). This occurrence is commonly referred to as a "disturb" event or "disturbance." For example, a disturbance in a cell that results when programming another cell may be referred to as a "program disturb," while one that results from reading another cell may be referred to as a "read disturb" and so forth.

Disturbs are particularly problematic in non-volatile memories, as unintended changes to the data state stored in memory cells will result in erroneous data being read from those cells. Accordingly, the incorporation of disturb management techniques into memory devices that help to reduce the occurrence of disturbs are particularly useful.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

This disclosure relates to techniques for reducing disturbs in non-volatile memory. Certain disclosed embodiments provide a method for operating a memory device that includes a non-volatile memory array made up of memory cells arranged in rows and columns. The memory cells include a first memory cell and second memory cell, and the method includes programming the first memory cell by applying a voltage to a first word line coupled to the first memory cell and another voltage to a terminal that is shared by the first memory cell and the second memory cell, wherein the voltages applied to the first word line and the shared terminal correspond to programming voltages. A further non-zero voltage may be applied to a second word line coupled to the second memory cell. The application of the non-zero voltage reduces a tunnel current across a gate oxide insulating the second word line from a substrate of the second memory cell. By reducing this tunnel current, the second memory cell is less likely to be disturbed during the programming of the first memory cell.

In accordance with certain disclosed embodiments, the shared terminal is a source terminal, and the voltage difference between the second word line and the shared source terminal when applying the non-zero voltage to the second word line is reduced compared to applying a zero voltage to the second word line. Reduction of the voltage difference by using the non-zero voltage reduces the strength of an electric field that can cause the tunnel current. By reducing the tunnel current, fewer electrons are available to be injected into a floating gate of the second memory cell, thus reducing the likelihood of the second memory cell being disturbed while the first memory cell is programmed.

Various refinements of the features noted above may exist in relation to various aspects of the present disclosure, and further features may also be incorporated therewith. Accordingly, this brief summary is intended to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION

One or more specific embodiments of the present disclosure are described below. These embodiments are intended to provide examples relating to various aspects of the presently disclosed techniques. In an effort to provide a concise description of these embodiments, all features of an actual implementation may not be described in the specification. It should be appreciated that in the development of any such implementation, as in any engineering or design project, numerous implementation-specific decisions are made to achieve the developers' specific goals, such as compliance with system-related and business-related constraints, which may vary from one implementation to another. Moreover, it should be appreciated that such development efforts might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. The embodiments discussed below are intended to be examples that are illustrative in nature and should not be construed to mean that the specific embodiments described herein are necessarily preferential in nature. Additionally, it should be understood that references to "one embodiment" or "an embodiment" within the present disclosure are not to be interpreted as excluding the existence of additional embodiments that also incorporate the recited features.

Figure 2:
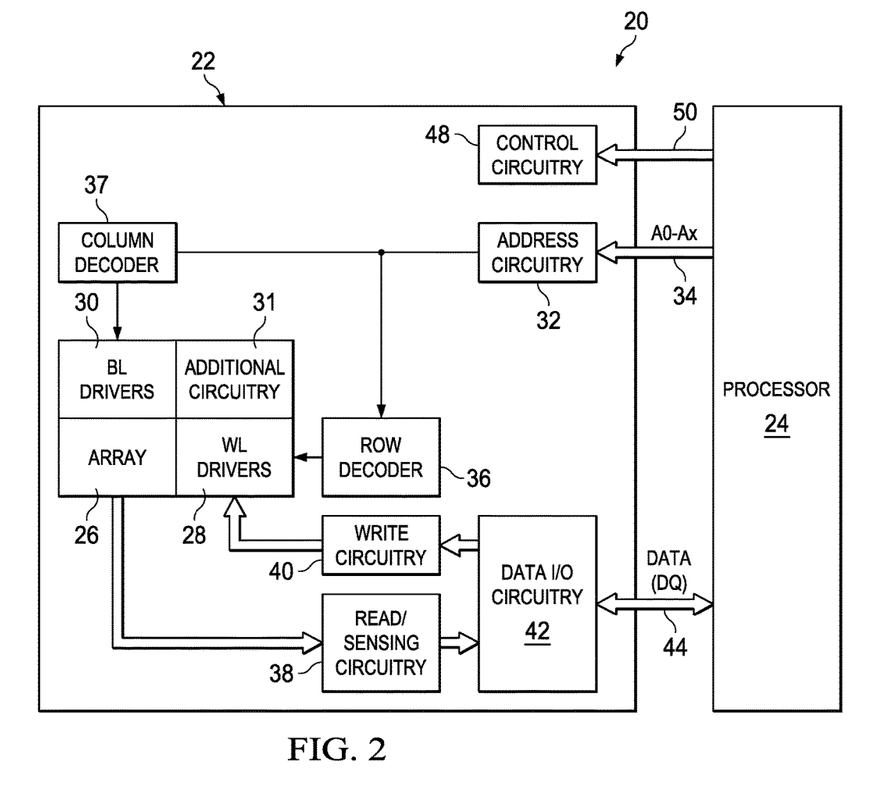
FIG. 2 is a functional block diagram depicting an electronic device that includes a non-volatile memory array that implements disturbance management techniques in accordance with aspects of this disclosure.

Referring to FIG. 2, a functional block diagram of an electronic device 20 that includes a memory device 22 and processor 24 is shown in accordance with one embodiment. The memory device 22 includes a memory array 26. The array 26 is a non-volatile memory array having bit cells arranged in rows and columns. While a single non-volatile memory array is shown in FIG. 2 for simplicity, some embodiments of memory device 22 may include multiple arrays, which can include volatile memory arrays, such as dynamic or static random access memory (RAM), in addition to non-volatile memory arrays. As will be discussed in further detail below, the array 26 may implement techniques for reducing the occurrence of disturbs in the bit cells during operation.

The memory device 22 includes word line driving circuitry 28 and bit line driving circuitry 30 operably coupled to the memory array 26. Additional circuitry 31, which may drive lines other than bit lines and word lines is also shown here. Memory cells, which may be referred to as bit cells, arranged in the same row share a common word line, and each word line may be driven by a word line driver in word line driving circuitry 28. Memory cells arranged in the same column share a common bit line, and each bit line may be driven by a bit line driver in bit line driving circuitry 30. The bit cells may include transistors having floating gate elements for data storage. It will be appreciated that memory device 22 has been simplified to focus on features that are helpful in understanding the present disclosure.

The processor 24 coupled to memory device 22 may control the general operation of the device 20. For instance, processor 24 may provide the processing capability to execute an operating system, programs, user and application interfaces, and any other functions of the device 20. The processor 24 may include a general-purpose or application-specific (ASIC) processor based upon x86 or RISC architectures, field-programmable gate array (FPGA), graphics processor (GPU), digital signal processor, a system-on-chip (SoC) processor, microcontroller, and/or related chip sets. By way of example only, processor 24 may include a model of a digital signal processor, an embedded processor, or a microcontroller available from Texas Instruments Inc. of Dallas, Tex.

Instructions or data to be processed by the processor 24 may be stored in memory device 22. The memory device 22 may store a variety of information and may be used for various purposes. For example, the memory device 22 may store firmware, such as a basic input/output system (BIOS), an operating system, various programs, applications, or any other routines that may be executed on device 20, such as user interface functions, processor functions, and so forth. The processor 24 may issue commands to the memory device 22, such as a read command to retrieve data from array 26, or a write command to write data to array 26.

The memory device 22 includes address buffer circuitry 32, which is operable to latch address signals provided on address input connections 34 (A0-Ax) provided between the memory device 22 and the processor 24. Address signals may be received and decoded by a row decoder 36 and a column decoder 37 to access memory array 26. For example, a word line may be selected based upon a portion of an address value that identifies a row of the array 26, and a bit line may be selected based upon a portion of the address value that identifies a column of the array 26. As will be appreciated by those skilled in the art, the number of address input connections depends upon the density and architecture of memory array 26. For instance, memory arrays with a higher number of bit cells, banks, and/or blocks may have a greater number of addressable locations, and thus more possible addresses.

The memory device 22 reads data in the array 26 in response to a read command by sensing voltage or current changes in the memory array columns using read and sensing circuitry 38. The read and sensing circuitry 38 may include sense amplifying circuitry and may read and latch a row of data from the memory array based an address provided with a read command. Similarly, memory device 22 may also write data to array 26 in response to a write command using write circuitry 40. For non-volatile memory, such as array 26, a write operation, often referred to as a program operation or programming, may be preceded by an erase operation that erases addressed cells in preparation for programming. Data input and output (I/O) circuitry 42 may include one or more data buffers and may provide for bi-directional data communication over a set of data (DQ) connections 44 arranged between the memory device 22 and the processor 24. The data I/O circuitry 42 is connected to read and sensing circuitry 38 and write circuitry 40. Thus, data connections 44 may pass data read from the array 26 from the memory device 22 to the processor 24 and may also provide to the memory device 22 data from the processor 24 that to be written to the array 26.

The memory device 22 further includes command control circuitry 48 operable to decode command signals provided from the processor 24 by way of command connections 50. The command signals are used to control the operations on the memory array 26. For instance, these command signals may include read, program, and erase commands that cause the memory device 22 to read data from or write data to bit cells of the non-volatile memory array 26.

In some embodiments, the electronic device 20 may be an embedded processor or microcontroller or the like. It should be understood that the example electronic device 20 of FIG. 2 may be any type of device that incorporates non-volatile memory. For example, one embodiment of the device 20 may be a microcontroller unit (MCU) capable of operating over a wide temperature range with generally low power consumption, and which includes a low power processor (24), a volatile memory, such as SRAM, the non-volatile memory device (22), as well as analog and mixed signal and power management circuitries. Such a device may be suitable for a number of applications in various industries, for example, automotive applications. In other embodiments, the electronic device 20 may be a computing device, such as a mobile telephone, digital media player, a desktop, tablet, or notebook computer, and so forth. In such embodiments, the device 20 may include one or more additional functional blocks not necessarily depicted in FIG. 2, such as input/output (I/O) ports, input structures, networking circuitry enabling the device 20 to communicate with a network and/or with other electronic devices, a power source, and/or a display. The various functions of the device 20 may be implemented using hardware elements (such as circuitry), software elements (such as computer instructions stored on a tangible computer-readable medium) or a combination of both hardware and software elements.

Figure 3:
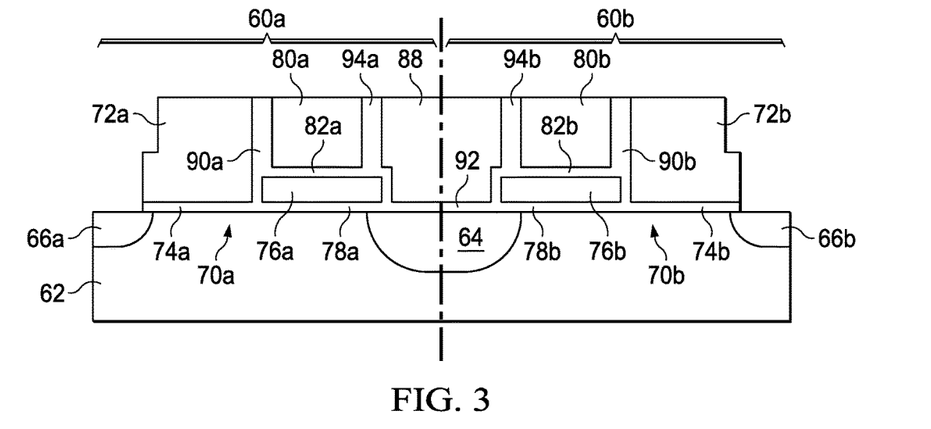
FIG. 3 is a cross-sectional view of two adjacent memory cells located in a column of the non-volatile memory array of FIG. 2 in accordance with aspects of this disclosure.
Figure 4:
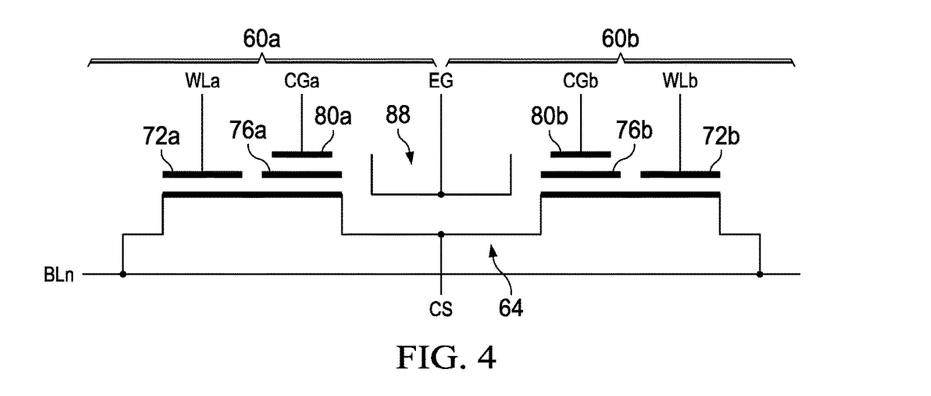
FIG. 4 is a schematic representation of the two memory cells depicted in FIG. 3 in accordance with aspects of this disclosure.

FIG. 3 depicts a cross-sectional view of two non-volatile memory cells 60a and 60b. FIG. 4 shows a corresponding schematic representation of the memory cells 60a and 60b. The following description of the memory cells 60a and 60b refers to FIGS. 3 and 4 concurrently. The memory cells 60a and 60b may be part of the non-volatile memory array 26 of FIG. 2. As shown, the memory cells 60a and 60b are both connected to the same bit line BLn and may be adjacent memory cells in the same column of the array 26. Memory cells 60a and 60b have the same structure. Focusing on memory cell 60a for explanatory purposes, the memory cell 60a includes a semiconductor substrate 62 of a first conductivity type, such as P type. The substrate 62 includes a first region 64 and a second region 66a, both of which are of a second conductivity type, such as N type. The first region 64 may represent a source terminal and the second region 66a may represent a drain terminal. The second region 66a may be connected to the bit line BLn. The source terminal formed by the region 64 may be shared by the memory cells 60a and 60b and is connected to a common source line CS. Between the first region 64 and second region 66a is a channel region 70a which provides for conduction of charge between the first region 64 and the second region 66a.

A word line WLa forms or is otherwise connected to a select gate 72a that is positioned over a first portion of the channel region 70a (e.g., a portion immediately abutting the second region 66a) and insulated therefrom, for example, by a gate oxide 74a disposed between the select gate 72a and the substrate 62. The select gate 72a may have a little overlap with the second region 66a, as shown in FIG. 3, or may have no overlap. A floating gate 76a is positioned over another portion of the channel region 70a. The floating gate 76a is laterally spaced from and adjacent to the select gate 72a and is insulated from the substrate 62 by a gate oxide 78a. In the depicted embodiment, the floating gate 76a may overlap a portion of the first region 64 to provide coupling from the first region 64 to the floating gate 76*a*.

A control gate 80*a* (also referred to as a coupling gate) is positioned over the floating gate 76*a* and is insulated therefrom by an oxide 82*a*. The control gate 80*a* is also positioned between the select gate 72*a* and an erase gate 88, and is connected to control gate line CGa, as shown in FIG. 4. An oxide 90*a* insulates the select gate 72*a* from the control gate 80*a* and the floating gate 76*a*. The erase gate 88 is positioned over the first region 64 of the substrate 62 and is insulated therefrom by gate oxide 92. The erase gate 88 is also arranged adjacent to the floating gate 76*a* and the control gate 80 as shown and is insulated therefrom by oxide 94*a*. The erase gate 88 is connected to erase gate line EG and may be shared by the memory cells 60*a* and 60*b*.

The adjacent memory cell 60*b* shown in FIGS. 3 and 4 has a structure identical to the memory cell 60*a*, but is a mirror image with respect to the dashed line in FIG. 3 through the erase gate 88. It should thus be understood that like components in memory cell 60*b* are denoted with the same reference number as corresponding components in memory cell 60*a*, but with a "b" appended thereto instead of an "a". For example, structure 76*b* is a floating gate for the memory cell 60*b*, whereas structure 76*a* is the floating gate for memory cell 60*a*. The erase gate 88 and the first (source) region 64 are shared by memory cells 60*a* and 60*b*. In one embodiment, the control gates 80*a* and 80*b* of memory cells 60*a* an 60*b*, respectively, may be share a common control gate driver. For example, although FIG. 4 shows discrete control gate lines CGa and CGb connected to control gates 80*a* and 80*b*, respectively, the control gate lines CGa and CGb may be driven by the same control gate driver. The structure of the transistor shown in FIGS. 3 and 4 of each of the memory cells 60*a* and 60*b* provides for a discrete select gate and control gate, and may be referred to as a split-gate transistor. While the elements described in FIG. 3 for providing insulation between the various depicted structures of the memory cells 60*a* and 60*b*, such as elements 74, 78, 80, 82, 92, and 94 are referred to as "oxides," those skilled in the art will appreciate that these elements may be formed using any suitable dielectric material, such as an oxide, a nitride, or a combination of an oxide and nitride. In one embodiment, the oxide 82 providing insulation between the control gate 80 and floating gate 76 may be formed from an oxide-nitride-oxide (ONO) layer.

The memory cells 60*a* and 60*b* may be operated upon in response to commands received by control circuitry 48. When either or both memory cells 60*a* and/or 60*b* are selected in response to a command, depending on whether the command indicates a read, program, or erase operation, appropriate voltages corresponding to the indicated operation are applied to the select gate 72, control gate 80, erase gate 88, and source 64 of the selected memory cell(s). A selected memory cell may refer to one identified (e.g., by address) along with a received command, whereas an unselected memory cell is one not so identified.

To briefly describe the operation of the non-volatile array 26, assume memory device 22 receives a command selecting memory cell 60*a* to be erased. In one example embodiment, the cell 60*a* is erased using Fowler-Nordheim tunneling by applying an erase voltage to the erase gate 88, and 0V to other terminals of the selected memory cell 60*a*, such as the source 64, select gate 72*a* (WLa), control gate 80*a*, and drain 66*a* (bit line BLn). This results in electrons tunneling from the floating gate 76*a* into the erase gate 88, which causes the floating gate to become positively charged. In an erased state, a read operation will result in current flow in the channel region 70*a* between the drain terminal 66*a* and source terminal 64, thus indicating a logical 1. By way of example only, an erase voltage applied to the erase gate 88 during an erase operation may be a relatively high voltage, such as between approximately 8V and 14V. For instance, in certain embodiments, the erase voltage may be approximately 11V, 12V, or 13V.

When memory cell 60*a* is selected to be programmed, programming voltages are applied to program the cell 60*a*. For example, a relatively high voltage is applied to the control gate 80*a*, with lesser voltages applied to the erase gate 88, the source 64, and select gate 72*a* (WLa). A relatively small programming current may be applied to the bit line BLn, which will cause the bit line BLn to bias at a voltage. For instance, the voltage to which BLn biases may be equal to the voltage on the word line (WLa) less the threshold voltage of the select gate 72*a* when the bit line BLn acts as the source. This results in a portion of the electrons in the channel region 70*a* that flow across the gap between the select gate 72*a* and the floating gate 76*a* acquiring enough energy to inject into the floating gate 76*a*. This mechanism is referred to as hot carrier injection. As a result, the floating gate 76*a* becomes negatively charged so that a read operation results in no current flow in the channel region 70*a*, which corresponds to a logical 0. By way of example only, in a program operation, a voltage of between approximately 8V and 12V may be applied to the control gate 80*a*, a voltage of between approximately 4V and 5V may be applied to both the source 64 and the erase gate 88, and a voltage of between approximately 0.8V and 1.3V may be applied to the select gate 72*a*. For instance, programming the cell 60*a* in one embodiment may apply approximately 10.5V to the control gate 70*a*, 4.5V to each of the source 64 and the erase gate 88, and 1V to 1.1V to the select gate 72*a*. A programming current applied to the bit line BLn may be between approximately 1 µA and 3 µA, which may result in the bit line BLn biasing to a voltage of approximately 0.3V.

When memory cell 60*a* is selected for a read operation, read voltages are applied to read a data state from the cell 60*a*. In one example embodiment, 0V may be applied to the erase gate 88 and the source 64, a voltage of between approximately 2.7V and 3.3V (e.g., approximately 3.0V) may be applied to the select gate 72*a*, a voltage of between approximately 1.5V and 2.0V (e.g., approximately 1.8V) may be applied to the control gate 80*a*, and a voltage of between approximately 1.0V and 1.5V (e.g., approximately 1.2V) may be applied to the drain 66*a* (by bit line BLn). Depending on the amount of charge in the floating gate 76*a* at the time of the read, current will either flow (indicating a data state of 1) or not flow (indicating a data state of 0) in the channel region 70*a* in response to the control gate voltage. In an erased state, the absence of trapped electrons on the floating gate 76*a* allows for current to flow in the channel region 70*a* in response to applying the control gate voltage. In a programmed state, the floating gate 76*a* may be negatively charged due to the presence of trapped electrons, which effectively increases threshold voltage by shielding the channel region 70*a* from the control gate 80*a*, thus impeding current flow in the channel region 70*a*.

As noted above, the cells 60*a* and 60*b* share the erase gate 88 and source 64. Thus, applying a voltage on the erase gate 88 and source 64 results in those voltages being applied to both of the cells 60*a* and 60*b*. Further, in an embodiment where control gates 80*a* and 80*b*, though shown as physically separate structures in FIG. 3, are driven by a common control gate driver circuit, applying a control gate voltage using the control gate driver will apply the same voltage to control gates 80a and 80b. In other words, if cell 60a is selected for a given operation and cell 60b is intended to be unselected, a voltage applied to the control gate 80a of selected cell 60a may nonetheless also be applied to the control gate 80b of unselected cell 60b. In further embodiments, a common control gate driver may be shared by more than two cells in a given column of the array, such as by four, eight, or even sixteen or more cells. As can be appreciated, sharing of control gate driver circuits among multiple cells can serve to reduce driver circuitry area, and thus reduce overall device size and manufacturing costs.

Though not shown specifically in FIG. 2, the drivers for the control gates 80 (e.g., driving the CG lines), for the source 64 (e.g., driving the CS lines) and the erase gate 88 (e.g., driving the EG lines) may be included as part of the additional circuitry 31. The additional circuitry 31, along with the word line drivers 28 and bit line drivers 30, may be considered as peripheral circuits of the memory array 26. Scaling down these peripheral circuits is sometimes more challenging than scaling down the array and, therefore, a reduction in peripheral circuit area, such as by sharing driving circuits, can be beneficial in this regard.

As briefly alluded to in the background section of this disclosure, disturbs relate to unintended and unwanted electrical behavior observed in non-volatile memory devices. Their occurrence can worsen as non-volatile memory devices scale to increasingly smaller sizes in which circuit structures and wiring in a memory array, such as array 26, are arranged increasingly closer together. Disturbs typically manifest as a data state in an unselected memory cell changing in response to being stressed by activity on a nearby cell. For instance, referring to memory cells 60a and 60b of FIGS. 3 and 4 as an example, when cell 60a is selected for a given operation, such as programming, and cell 60b is unselected, the voltages applied as a result of programming selected cell 60a may stress adjacent unselected cell 60b in such as a way that data stored by cell 60b changes states, resulting in a disturb. As this disturb occurs during programming, it is referred to as a program disturb (e.g., as opposed to a read disturb during reading, etc.). Since the cells 60a and 60b are adjacent cells in the same column in this example, this disturb behavior can also be referred to as a column disturb.

As non-volatile memory devices are scaled down in size, the structures forming the individual bit cells of the array become increasingly smaller. For example, as cells having a configuration like that shown in FIGS. 3 and 4 are scaled down in size, the various structures, such as source 64, drain 66, select gate 72, floating gate 76, control gate 80, and erase gate 88 are scaled down in size accordingly. Furthermore, the gate oxide materials insulating these structures from one another are also scaled down, such as by a reduction in their thickness.

Figure 5:
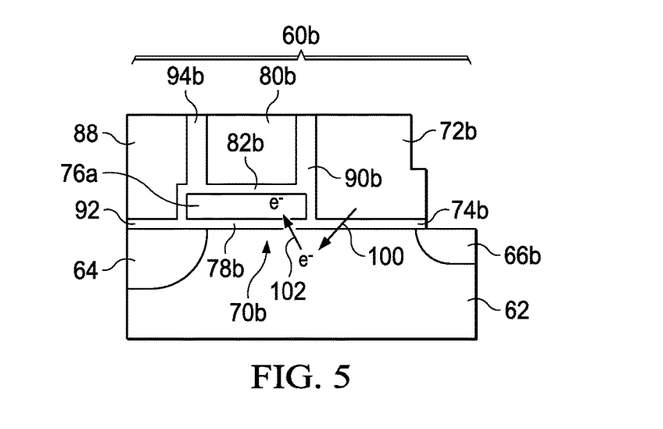
FIG. 5 illustrates a disturb mechanism occurring on one of the memory cells of FIG. 3 as the other memory cell is programmed in accordance with aspects of this disclosure.

In accordance with aspects of the present disclosure, FIG. 5 illustrates a program disturb mechanism that can occur on an unselected cell 60b when adjacent cell 60a is selected and undergoes a programming operation. Referring to the example embodiment described above, assume that the selected cell 60a has a voltage of approximately 10.5V applied to its control gate 80a, approximately 4.5V applied to each of the erase gate 88 and source 64 and approximately 1.0V applied to the select gate 72a (by word line WLa). A programming current of approximately 1 µA applied to bit line BLn will bias the bit line BLn, which is connected to drain terminal 66a, to a voltage that is based on the applied select gate voltage (1.0V). For example, bit line BLn may bias at a voltage of between approximately 0.3V and 0.5V.

With respect to the unselected cell 60b, since the erase gate 88 and source 64 are shared, and since control gate 80b and control gate 80a of the selected cell 60a are driven by a common control gate driver, the unselected cell 60b will have the same voltages at the erase gate 88, source 64, and control gate 80b as those applied to the corresponding terminals of the selected cell 60a. Further, the voltage applied to the drain 66a of selected cell 60a will also be applied to drain 66b of unselected cell 60b, as drains 66a and 66b are both connected to the same bit line BLn.

Conventionally, a standard voltage of 0V has been applied to the select gate 72b of the unselected cell 60b when the adjacent selected cell 60a is being programmed. However, it has been observed that as the gate oxide 74b insulating the select gate 72b from the channel 70b becomes increasingly thinner, direct electron tunneling from the select gate 72b into the channel 70b may occur when the selected cell 60a is being programmed under this condition. This is indicated by arrow 100 in FIG. 5. This tunneling 100 of electrons (e) to the channel 70b may be due to a voltage differential between the select gate 72b and the source 64 and/or the channel surface potential of channel 70b that results in an electrical field. For instance, assuming 4.5V is applied at the source 64 and 0V is applied to word line WLb driving select gate 72b, an electric field due to the voltage difference between the source 64 and select gate 72b may result electrons (e) tunneling through the gate oxide 74b into the channel 70b. This tunneling 100 may be assisted by traps present in the gate oxide 74b, such as defects in the dielectric layer forming the gate oxide 74b. This tunneling can be thought of as the result of the select gate 72b being biased such that the gap between the channel region under the floating gate 76b and the select gate 72b acts like a depletion region area.

When the unselected cell 60b is in an erased state (corresponding to a logical 1), the application of 10.5V to the control gate 80b due to selected cell 60a being programmed may result in the channel region 70b under the floating gate 76b being strongly inverted. In this example, the voltage at floating gate 76b when unselected cell 60b is in the erased state may be at or above approximately 8V. This may result in a relatively strong vertically-oriented electric field (e.g., perpendicular to channel 70b) under the floating gate 76b, which can cause the tunneled electron(s) (e) to be swept up into the floating gate 76b by a hot carrier injection mechanism, as indicated by arrow 102. A program disturb occurs on the unselected cell 60b when enough electrons are injected into the floating gate 76b so that it has a sufficient negative charge to change it from an erased state (logical 1) to a programmed state (logical 0). Thus, this disturb alters the data so that a later read performed on the cell 60b returns an incorrect value.

It has been observed that the program disturb mechanism depicted in FIG. 5 becomes increasingly problematic as the gate oxide 74b approaches thinner dimensions. For instance, as the thickness of the gate oxide 74b between the select gate 72b and channel 70b reaches dimensions of less than 30 angstroms (Å), such as between approximately 20 Å and 27 Å, the tunneling 100 behavior may result in a non-trivial amount of current through the gate oxide 74b. The gate oxide 74b may approach dimensions of this range at process nodes of 65 nanometers (nm) or less, for example 65 nm, 40 nm, or even 28 nm processes. This mechanism occurs less frequently when the gate oxide is thicker, such as greater than 30 Å. For example, in some 90 nm processes, the gate oxide 74b thickness may be on the order of between approximately 65 Å and 70 Å, and the behavior shown in FIG. 5 is less likely to occur due to the thicker oxide.

Figure 6:
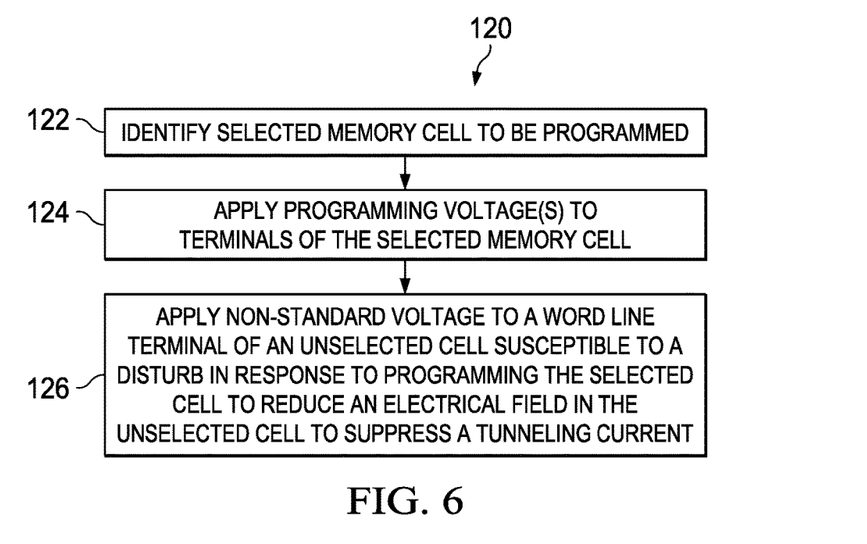
FIG. 6 depicts a method for reducing the disturb mechanism shown in FIG. 5 in accordance with aspects of this disclosure.

FIG. 6 illustrates a disturb management technique in accordance with an embodiment of the present disclosure that can reduce the program disturb mechanism depicted in FIG. 5. The method 120 in FIG. 6 begins at step 122 by identifying a selected memory cell in a non-volatile memory array that is to be programmed. For instance, the memory cell could be one of the cells 60a or 60b of array 26. Using cell 60a as an example of a selected cell, the identification of the selected cell may be in response to address information (e.g., received by address circuitry 32) supplied to the memory array 26 in conjunction with a command (e.g., received by control circuitry 48) indicating a program operation. Once the selected cell 60a is identified for programming, appropriate programming voltages are applied to the terminals of the selected memory cell at step 124. For instance, using the example provided in FIGS. 3 and 4, the applied programming voltages to cell 60a may be 1.0V at select gate 72a, 10.5V at control gate 80a, 4.5V at erase gate 88, and 4.5V at source 64. These applied voltages may cause the floating gate to become negatively charged due to hot carrier injection of electrons from the channel region 70a, thus resulting in the cell 60a being in a programmed state (logical 0).

At step 126, a non-standard voltage is applied to a word line terminal of an unselected cell that is susceptible to being disturbed in response to the programming of the selected cell 60a. The unselected cell may be an adjacent bit along the same bit line (column), such as cell 60b. In this example embodiment, the unselected cell 60b may have one or more terminals either shared with selected cell 60a or otherwise driven by common driving circuitry. For example, cell 60b shares a source 64 and erase gate 88 with cell 60a, and has a control gate 80b driven using a driver circuit that also drives the control gate 80a of cell 60a. An unselected cell susceptible to being disturbed may also be a cell that is located diagonally adjacent to the selected cell 60a, such as a cell adjacent to cell 60b along word line WLb (row). In this case, a source terminal of a diagonally adjacent unselected cell is not shared with the selected cell, but may have the same voltage applied if driven using the same source line. While step 126 is shown illustratively as occurring after step 124, it should be understood that steps 124 and 126 may occur concurrently in actual operation.

As noted above, conventional techniques for operating a non-volatile memory of this type drive the word line of an unselected cell at 0V. The term "non-standard" is used herein to describe the voltage applied to word line of the unselected cell to indicate that it is a voltage other than a standard 0V that would be applied conventionally. The non-standard voltage used in the present embodiment may be a non-zero voltage applied to word line WLb of unselected cell 60b. This non-zero voltage at the select gate 72b may reduce electrical fields in the cell 60b that may cause tunneling 100 of electrons from the select gate 72b to the channel 70b through the gate oxide 74b, as described in FIG. 5. The non-standard voltage may be have a relatively low magnitude, such as between approximately 0.1 and 0.5V, when compared to the voltages applied to the shared source 64 (4.5V) and erase gate 88 (4.5V), as well as the control gate 80b (10.5V), but be of the same sign as a voltage responsible for the field that is being reduced. To provide an example, when a non-standard voltage of approximately 0.3V is applied to select gate 72b, the electric field due to the 4.5V at the source 64 is reduced since the absolute difference (the delta) of the voltage between the select gate 72b and the source 64 is reduced from 4.5V (when a standard voltage of 0V is applied to the unselected word line WLb) to 4.2V. This may at least partially suppress the current due to the tunneling of electrons (100 in FIG. 5) from the select gate 72b caused by the electrical field resulting from the voltage difference between the source 64 and the select gate 72b. As fewer electrons tunnel from the select gate 72b into channel 70b when the non-standard voltage is applied to word line WLb, fewer electrons will be injected into the floating gate 76b due to the vertical field (102 in FIG. 5). The program disturb mechanism shown in FIG. 5 may, therefore, be reduced.

To apply the non-standard voltage, the word line driver 28 of the memory device 22 may include word line driving circuits that are configured to drive the word lines of unselected cells at the non-standard voltage. In some embodiments, the word line drivers may apply a combination of a standard 0V voltage and non-standard voltages to the word lines of unselected cells. For instance, non-standard voltages may be applied to cells, such as cell 60b, that are particularly susceptible to being disturbed due to their close proximity relative to a selected cell, while a standard 0V voltage may be applied to cells that that are either less susceptible or not susceptible to being disturbed. In another embodiment, the non-standard voltage may be used on all word lines not corresponding to a selected cell.

In some embodiments, program disturbs in the unselected cell 60b may be further mitigated by additionally suppressing lateral drift currents in the channel 70b between the drain 66b and source 64. For example, when a relatively large voltage of 4.5V is applied to the common source 64 during programming, current will naturally tend to move between the common source 64 and the drain terminals 66a, 66b, which are at a lower voltage, due to the voltage difference. An inhibit voltage lower than the common source programming voltage, such as approximately 1.5V in one example embodiment, may be applied to the bit line BLn to suppress this lateral drift current. This inhibit voltage can be applied along with the relatively low non-standard non-zero voltage applied to select gate 72b, such as approximately 0.3V when referring to the example described above. This results in the select gate 72b device exhibiting a negative gate to source ($V_{gs}$) voltage, thereby suppressing such lateral currents.

Figure 7:
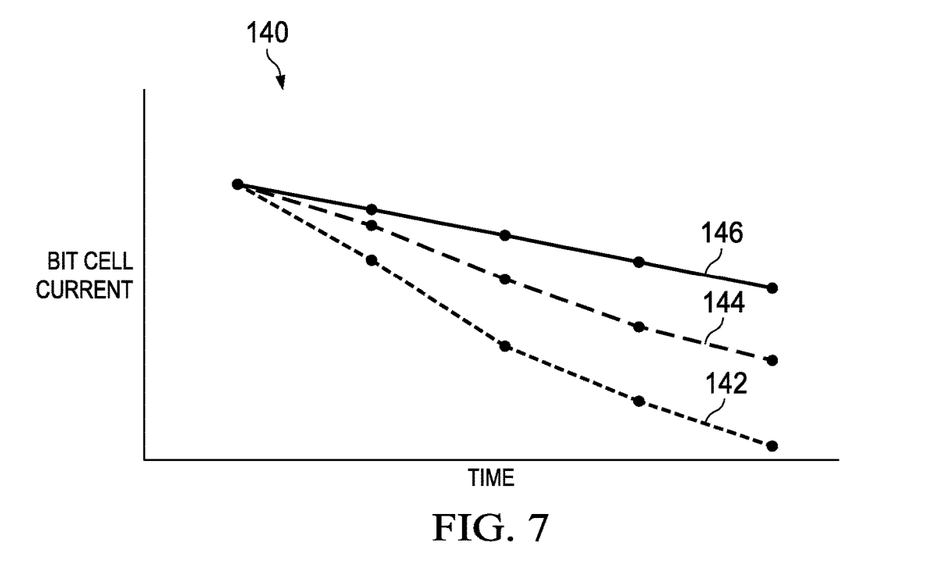
FIG. 7 is a graph that compares bit cell current of an unselected cell being disturbed when standard and non-standard voltages are applied to a word line corresponding to the unselected cell.

FIG. 7 is a graph 140 showing the bit cell current over time for an unselected cell, such as cell 60b, as it is disturbed in response to a programming operation on a selected cell, such as cell 60a. Curve 142 represents the bit cell current when a standard conventional voltage of 0V is applied to the word line WLb of unselected cell 60b as selected cell 60a is programmed. Curve 144 represents the bit cell current when a non-standard voltage of approximately 0.2V is applied to the word line WLb of unselected cell 60b when selected cell 60a is programmed. As shown, the bit cell current over time on curve 144 decreases more slowly compared to curve 142. This reduction in the decrease of the bit cell current over time on curve 144 is due to the reduction of the electrons that tunnel from the select gate 72b into the channel 70b. As the non-standard voltage is further increased to 0.4V, as represented by curve 146, the decrease in the bit cell current over time is reduced even further. By reducing the loss of current over time, the program disturb mechanism shown in FIG. 5 can be reduced, since a longer time is required to reach the same amount of threshold voltage shift in the cell 60b that would result in a disturbance of its data state.

As will be understood, the various techniques described above for managing disturbances in non-volatile memory devices are provided herein by way of example only.

Accordingly, it should be understood that the present disclosure should not be construed as being limited to only the examples provided above. It should be appreciated that the disturb management techniques disclosed herein may be implemented in any suitable manner, including hardware (suitably configured circuitry, such as word line driver 28), software (e.g., via a computer program including executable code stored on one or more tangible computer readable medium), or via using a combination of both hardware and software elements.

While the specific embodiments described above have been shown by way of example, it will be appreciated that many modifications and other embodiments will be apparent to one skilled in the art having the benefit of this disclosure. Accordingly, it is understood that various modifications and embodiments are intended to be included within the scope of the appended claims.

What is claimed is:

1. A method of operating a memory device having a non-volatile memory array including first and second memory cells formed on a substrate, the method comprising:
    programming the first memory cell by:
        applying a first voltage to a first word line so that the first voltage is received at a first select gate of the first memory cell, the first select gate being coupled to the first word line;
        applying a second voltage to a source terminal that is shared by the first memory cell and the second memory cell, wherein the second voltage is greater than the first voltage; and
        applying a third voltage to a second word line so that the third voltage is received at a second select gate of the second memory cell, the second select gate being coupled to the second word line;
        wherein the third voltage is a non-zero voltage that is less than 1V with the third voltage and the first voltage being unequal but having a same sign.

2. The method of claim 1, wherein the sign of the third voltage is the same as a sign of the second voltage.

3. The method of claim 1, wherein a voltage difference between the second word line and the shared source terminal when the non-zero voltage is applied to the second word line during programming of the first memory cell is reduced compared to when a zero voltage is applied to the second word line during programming of the first memory cell.

4. The method of claim 3, wherein, when the non-zero voltage is applied to the second word line during the programming of the first memory cell, a tunnel current across a gate oxide insulating the second word line from the substrate is reduced compared to when the zero voltage is applied to the second word line during the programming of the first memory cell.

5. The method of claim 4, wherein the reduction in the voltage difference between the second word line and the shared source terminal when the non-zero voltage is applied is due at least in part to a reduction in a strength of an electric field causing the tunnel current.

6. The method of claim 1, wherein the third voltage applied to the second word line is between approximately 0.1V and 0.5V, the first voltage applied to the first word line is between approximately 0.8V and 1.3V, and the second voltage applied to the shared source terminal is between approximately 4V and 5V.

7. The method of claim 1, wherein:
    the first memory cell includes a first split gate transistor including the shared source terminal formed in the substrate, a first drain terminal formed in the substrate, a first channel region formed in the substrate between the first drain terminal and the shared source terminal, a first floating gate, and a first control gate, with the first select gate being positioned over a first portion of the first channel region, the first floating gate being positioned over a second portion of the first channel region and located closer to the shared source terminal than the first select gate, and the first control gate being positioned over the first floating gate; and
    the second memory cell includes a second split gate transistor including the shared source terminal formed in the substrate, a second drain terminal formed in the substrate, a second channel region formed in the substrate between the second drain terminal and the shared source terminal, a second floating gate, and a second control gate, with the second select gate being positioned over a first portion of the second channel region, the second floating gate being positioned over a second portion of the second channel region and located close to the shared source terminal than the second select gate, and the second control gate being positioned over the second floating gate.

8. The method of claim 7, wherein the first control gate and the second control gate are controlled by a common driver circuit.

9. The method of claim 7, comprising an erase gate positioned over the shared source terminal, the erase gate being shared by the first and second memory cells.

10. The method of claim 1, wherein the first and second memory cells are adjacent memory cells coupled to a same bit line in the non-volatile memory array.

11. The method of claim 1, wherein the second memory cell is in an erased state during the programming of the first memory cell.

12. The method of claim 1, wherein:
    the first voltage is also less than 1V; and
    the first voltage is greater than the third voltage.

13. A memory device comprising:
    a non-volatile memory array having a plurality of memory cells, the plurality of memory cells including a first memory cell having a first select gate coupled to a first word line and a second memory cell having a second select gate coupled to a second word line, the first and second memory cells being directly adjacent to each other and coupled to the same bit line, the first and second memory cells being formed on a substrate;
    word line driving circuitry to apply voltages to the first and second word lines; and
    control circuitry to receive commands to retrieve data from or to store data to the non-volatile memory array;
    wherein, when the control circuitry is configured to, upon receipt of a command for programming the first memory cell:
        cause a source line driver to apply a first voltage to a source terminal shared by the first and second memory cells;
        cause the word line driving circuitry to apply a second voltage to the first word line so that the second voltage is received at the first select gate, wherein the first voltage is greater than the second voltage; and
        cause the word line driving circuitry to apply a third voltage to the second word line so that the third voltage is received at the second select gate, the third voltage being a non-zero voltage that is less than 1V and the third voltage and the second voltage being unequal voltages but having a same sign.

14. The memory device of claim 13, wherein a voltage difference between the second word line and the shared source terminal when the non-zero voltage is applied to the second word line during programming of the first memory cell is reduced compared to when a zero voltage is applied to the second word line during programming of the first memory cell.

15. The memory device of claim 14, wherein, when the non-zero voltage is applied to the second word line during the programming of the first memory cell, a tunnel current across a gate oxide insulating the second word line from the substrate is reduced compared to when the zero voltage is applied to the second word line during the programming of the first memory cell.

16. The memory device of claim 13, wherein the first voltage applied to the shared source terminal is between approximately 4V and 5V, the second voltage applied to the first word line is between approximately 0.8V and 1.3V, and the third voltage applied to the second word line is between approximately 0.1V and 0.5V.

17. The memory device of claim 13, wherein the third voltage is less than the second voltage.

18. The memory device of claim 13, wherein the third voltage is less than the first voltage.

19. The memory device of claim 13, wherein the gate oxide has a thickness of less than approximately 30 angstroms.

20. The memory device of claim 13, wherein:
the first memory cell includes a first split gate transistor including the shared source terminal formed in the substrate, a first drain terminal formed in the substrate, a first channel region formed in the substrate between the first drain terminal and the shared source terminal, a first floating gate, and a first control gate, with the first select gate being positioned over a first portion of the first channel region, the first floating gate being positioned over a second portion of the first channel region and located closer to the shared source terminal than the first select gate, and the first control gate being positioned over the first floating gate; and
the second memory cell includes a second split gate transistor including the shared source terminal formed in the substrate, a second drain terminal formed in the substrate, a second channel region formed in the substrate between the second drain terminal and the shared source terminal, a second floating gate, and a second control gate, with the second select gate being positioned over a first portion of the second channel region, the second floating gate being positioned over a second portion of the second channel region and located close to the shared source terminal than the second select gate, and the second control gate being positioned over the second floating gate.

21. The memory device of claim 20, wherein the first control gate and the second control gate are controlled by a common control gate driver circuit of the memory device.

22. The memory device of claim 13, wherein:
the second voltage is also less than 1V; and
the second voltage is greater than the third voltage.

23. A memory device comprising:
a non-volatile memory array having a plurality of memory cells including a first memory cell coupled to a first word line and a second memory cell coupled to a second word line, the first and second word lines being adjacent to one another;
control circuitry that receives commands to retrieve data from or to store data to the non-volatile memory array; and
driving circuitry that, when the control circuitry receives a command for programming the first memory cell, applies a first voltage to a first terminal of the first memory cell, a second voltage to the first word line, and a third voltage to the second word line, the third voltage being a non-zero voltage having a same sign as the first voltage;
wherein the first terminal of the first memory cell is a source terminal that is shared with the second memory cell, the first voltage applied to the shared source terminal is between approximately 4V and 5V, the second voltage applied to the first word line is between approximately 0.8V and 1.3V, and the third voltage applied to the second word line is between approximately 0.1V and 0.5V.

24. The memory device of claim 23, wherein a voltage difference between the second word line and the shared source terminal when the third voltage is applied to the second word line during programming of the first memory cell is reduced compared to when a zero voltage is applied to the second word line during programming of the first memory cell.

25. The memory device of claim 23, wherein the first and second memory cells are directly adjacent to each other and coupled to a same bit line.

* * * * *